United States Patent
Suyama et al.

[19]

[11] Patent Number: 5,949,729
[45] Date of Patent: *Sep. 7, 1999

[54] MEMORY DEVICE WITH CURRENT LIMITING FEATURE

[75] Inventors: Junichi Suyama; Kazukiyo Fukudome; Akihiro Hirota, all of Tokyo, Japan

[73] Assignee: Oki Electric Industry Co., Ltd., Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/897,645

[22] Filed: Jul. 21, 1997

[30] Foreign Application Priority Data

Jul. 24, 1996 [JP] Japan .................... 8-195004

[51] Int. Cl.$^6$ ............................... G11C 7/02
[52] U.S. Cl. ............. 365/207; 365/205; 365/206; 365/226; 365/187.09
[58] Field of Search .................. 365/206, 207, 365/210, 226, 189.09, 205

[56] References Cited

U.S. PATENT DOCUMENTS

| | | | |
|---|---|---|---|
| 5,418,750 | 5/1995 | Shiratake et al. | 365/206 |
| 5,418,753 | 5/1995 | Seki | 365/207 |
| 5,446,694 | 8/1995 | Tanaka et al. | 365/207 |
| 5,539,701 | 7/1996 | Shimizu | 365/207 |
| 5,619,465 | 4/1997 | Nomura et al. | 365/206 |

FOREIGN PATENT DOCUMENTS

| | | | |
|---|---|---|---|
| 61-158094 | 7/1986 | Japan . | |
| 2765841 | 11/1987 | Japan | G05F 3/24 |
| 1-102894 | 4/1989 | Japan . | |
| 5-74156 | 3/1993 | Japan . | |

*Primary Examiner*—David Nelms
*Assistant Examiner*—Tuan T. Nguyen
*Attorney, Agent, or Firm*—Rabin & Champagne, P.C.

[57] ABSTRACT

A sense circuit for a DRAM circuit in which small potential difference between bit lines and is produced when the memory cell in the memory cell array is connected to one of the bit lines. The sense circuit starts sensing and amplifying when the sense starting signal changes to "L" level. An inverter provides a sense activating signal of "H" level to an NMOS device, while another inverter provides a sense activating signal of "L" level to a PMOS device. Sense amplifiers 33 are then activated and the potential difference between the bit lines and is amplified. Since the "L" level of the sense activating signal that is generated by the inverter is set to a value midway between a first power potential VSS and a second power potential VCC, the conductive resistance of the PMOS device is higher than that of a conventional circuit supplied with the first power potential VSS. Consequently, the voltage drop due to the PMOS device increases and power noise is reduced.

15 Claims, 14 Drawing Sheets

MEMORY DEVICE WITH CURRENT LIMITING FEATURE

BACKGROUND OF THE INVENTION

The present invention relates to a sense amplifier circuit that senses and amplifies the potential difference between a pair of bit lines connected to a semiconductor memory.

FIG. 1 shows a conventional main circuit for a dynamic random access memory (DRAM). As the figure indicates, there are a plurality of memory cells M1, M2, and so on, in a memory cell array 1 of a DRAM. Each memory cell has the same structure consisting of a parallel-plate capacitor 3 and an N-channel type metal oxide-silicon semiconductor (NMOS) device 2. One electrode of the capacitor 3 is connected to the source electrode of the NMOS device 2, while the other electrode of the capacitor is connected to a first reference potential VCP, which is the cell plate potential. The drain and gate electrodes of the NMOS device 2 in memory cell M1 are connected to a bit line BL and a word line WL0, respectively. The drain and gate electrodes of the NMOS device 7 in memory cell M2 are connected to a bit line BLB and a word line WL1, respectively.

The bit lines BL and BLB that are supplied to the memory cell array 1 are connected to an equalizing circuit 4. The equalizing circuit 4 is used to supply the same potential level on the bit lines BL and BLB, and consists of two NMOS devices 4a and 4b, the source electrodes of which are connected to a second reference potential VBL for the purpose of pre-charging the bit lines. The drain electrodes of the NMOS devices 4a and 4b are connected to the bit lines BL and BLB, respectively, while the gate electrodes (i.e., of the NMOS devices 4a and 4b) receive a control signal EQM. The level of the first reference potential VCP and second potential VBL is halfway between a first power potential VSS and a second power potential VCC. The VCP and VBL are generated by a VCP generating circuit 5 and a VBL generating circuit 6, respectively.

A sense circuit 10 is connected to the bit lines BL and BLB. In the sense circuit, the bit lines BL and BLB are connected to sense amplifier nodes NA and NAB by NMOS devices 11 and 12, respectively, which are transfer gates. Further, the gate electrodes of the NMOS devices 11 and 12 receive a control signal TG. When the control signal TG becomes active, the NMOS devices 11 and 12 are turned on. Consequently, the nodes NA and NAB become connected to the bit lines BL and BLB through NMOS devices 11 and 12, respectively.

Between the nodes NA and NAB is a sense amplifier 13 that consists of two P-channel type metal oxide silicon semiconductor (PMOS) devices 13a and 13b, the source electrodes of which are connected to each other. Further, between the node NA and node NAB is connected a second sense amplifier 14 that consists of NMOS 14a and 14b, the source electrodes of which are connected to each other. The node NA is connected to the drain electrodes of the PMOS device 13a and NMOS devices 14a, and to the gate electrodes of the PMOS device 13b and NMOS device 14b. The node NAB is connected to the drain electrodes of the PMOS device 13b and NMOS device 14b, and to the gate electrodes of the PMOS device 13a and NMOS device 14a.

The source electrodes of the PMOS device 13a and 13b are connected to the drain electrode of the PMOS device 15, the source electrode of which is connected to the second power potential VCC. The source electrodes of the NMOS device 14a and 14b are connected to the drain electrode of the NMOS device 16, the source electrode of which is connected to the first power potential VSS. The gate electrode of the NMOS device 16 receives connected to a sense amplifier activating signal SLNG, which is the output signal of an inverter 17, the input of which is a sense starting signal SLNGB. The gate electrode of the PMOS device 15 receives another sense amplifier activating signal SLPG, which is the output signal of an inverter 18, the input of which is the sense signal SLNG. The power and ground supplies of both inverters (17 and 18) are connected to the second power potential VCC and to the first power potential VSS, respectively, so that the output signal levels (of inverters 17 and 18) are either VCC or VSS, depending on the input signal level.

In an actual DRAM, a plurality of bit line pairs are supplied to a memory cell array 1. Accordingly, a plurality of sense circuits 10 are connected to corresponding bit line pairs. The PMOS device 15, the NMOS device 16, and the inverters 17 and 18, however, can be shared by several sense circuits.

FIG. 2 shows a waveform diagram illustrating the operation of the circuit in FIG. 1. The operation of a conventional DRAM will now be described with reference to FIG. 2.

When the control signal EQM falls from "H" level to "L" level, the NMOS devices 4a and 4b in the equalizing circuit 4 are turned off, and the bit lines BL and BLB are disconnected from the second reference potential VBL. When the potential level of the word line WL0 reaches a higher potential level (VCC+Vt(threshold voltage of the NMOS device 2 in memory cell M1)+a(operation margin of the NMOS device 2 in memory cell M1)), a small potential difference caused by memory cell data is provided to the bit lines BL and BLB. In addition, when the potential level of the word line WL0 reaches a higher potential level (VCC+Vt+a), the control signal TG also rises up to (VCC+Vt+a). This in turn activates the NMOS devices 11 and 12, and the bit lines BL and BLB become connected to the nodes NA and NAB, respectively.

The sense operation starts when the sense starting signal SLNGB falls from "H" level to "L" level. When the sense starting signal SLNGB drops to "L", the inverter 17 causes the sense amplifier activating signal SLNG to rise from "L" level to "H" level (VCC), and the sense amplifier activating signal SLPG falls from "H" level to "L" level (VSS). Therefore, both the PMOS device 15 and the NMOS device 16 are turned on and the sense amplifiers 13 and 14 are activated. The small potential difference between the nodes NA and NAB connected to the bit lines BL and BLB is sensed and amplified by the just-activated sense amplifiers 13 and 14 by charging and discharging the nodes NA and NAB through the PMOS device 15 and NMOS device 16, respectively.

There exists, however, the following problem in a conventional DRAM circuit. When the sense circuit 10 operates (i.e., when it senses and amplifies), power noise is generated by the charging and discharging current on the bit lines BL and BLB. Moreover, a voltage drop in the power supply occurs due to the parasitic resistance of the power supply wirings that provide the power potentials VSS and VCC to the NMOS device 16 and the PMOS device 15, respectively. The power noise reduces the operating margin of peripheral circuits.

SUMMARY OF THE INVENTION

Therefore, the object of the present invention is to provide a sense circuit which does not cause a sharp voltage drop on the power supply voltage. According to one aspect of the present invention, the sense circuit in a dynamic random access memory in which a plurality of memory arrays include a plurality of memory cells. A plurality of memory cells in each of the plurality of memory arrays have respective pieces of data, and the plurality of memory arrays share a voltage applied by a power supply for accessing of the pieces of the data. The sense circuit comprises sense means for sensing a current which flows out of the memory cell corresponding to the piece of data upon accessing the piece of data in the memory cell; amplification means for developing a specific voltage corresponding to the sensed current; and switching means for allowing a current in use for the development of the specific voltage to flow between the power supply and the amplification means in such a manner that the current therebetween does not cause the voltage applied to the plurality of memory cells to drop.

BRIEF DESCRIPTION OF THE DRAWINGS

The accompanying drawings, which are incorporated in and constitute part of the specification, illustrate embodiments of the invention and, together with the description, serve to explain the operation of the invention.

DESCRIPTION OF THE PREFERRED EMBODIMENTS

The preferred embodiments of the present invention will now be described in detail with reference to the accompanying drawings.

<First Embodiment>

Figure 1:
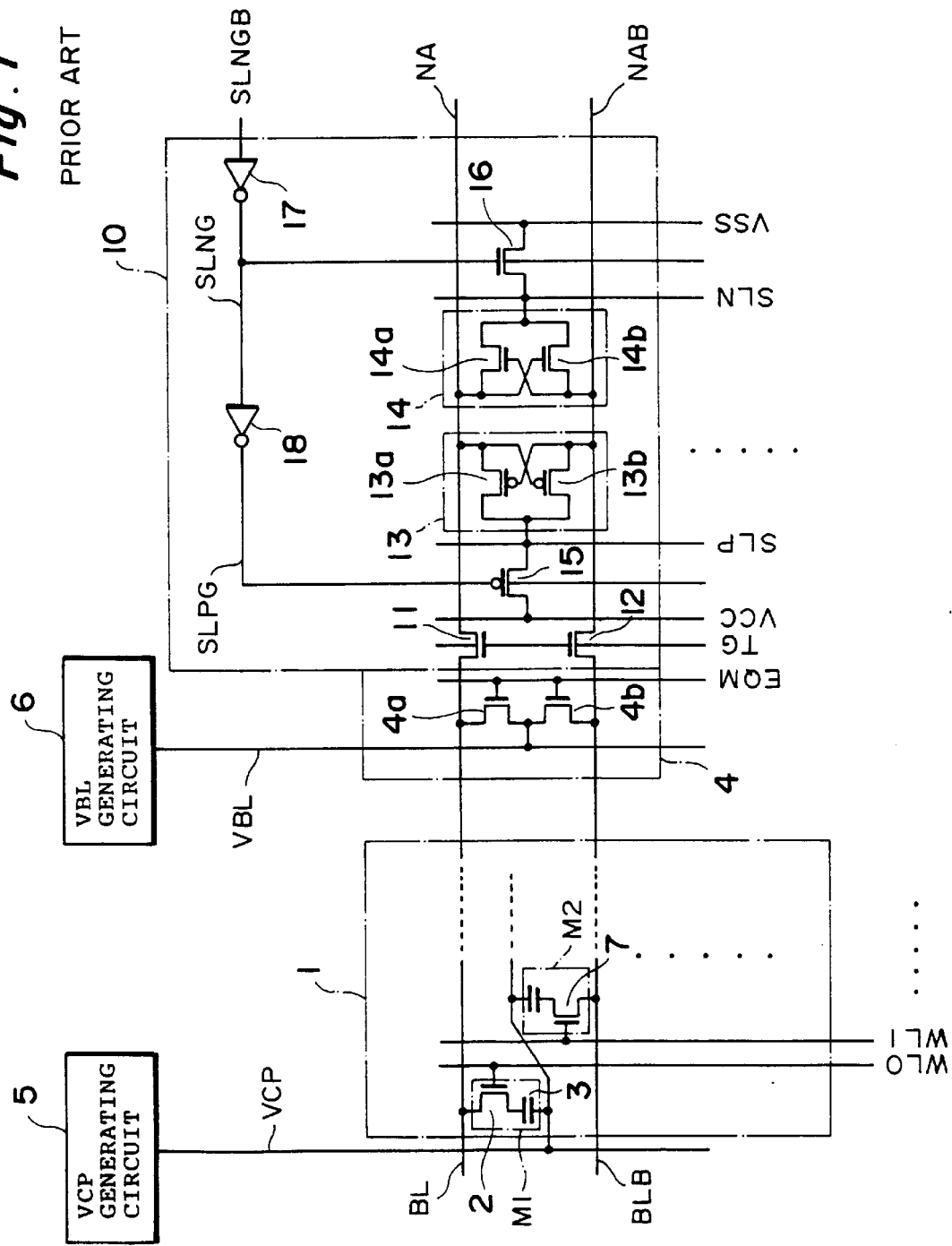
FIG. 1 shows the main circuit of a conventional DRAM.
Figure 2:
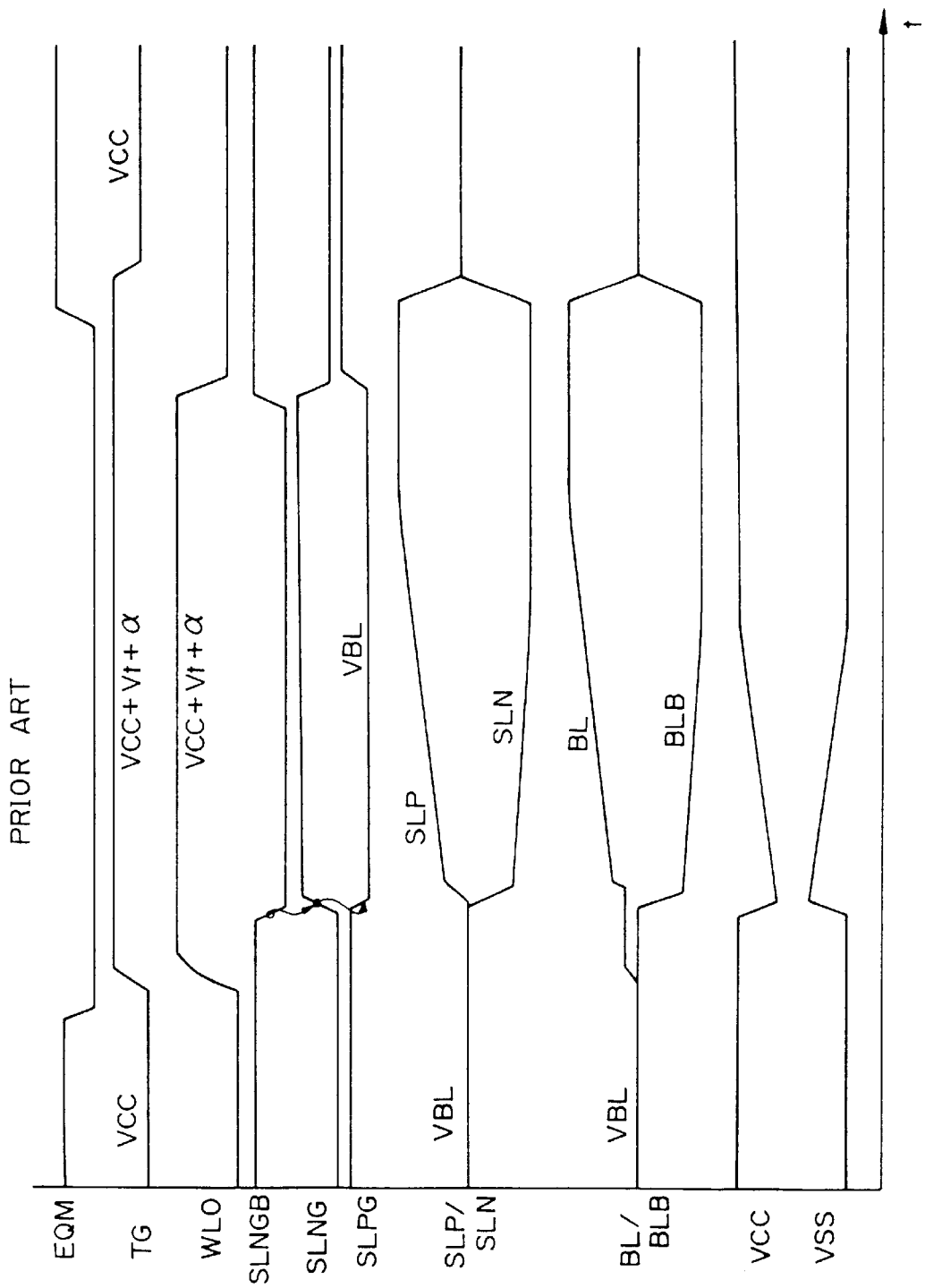
FIG. 2 shows a waveform diagram illustrating the operation of a conventional circuit.
Figure 3:
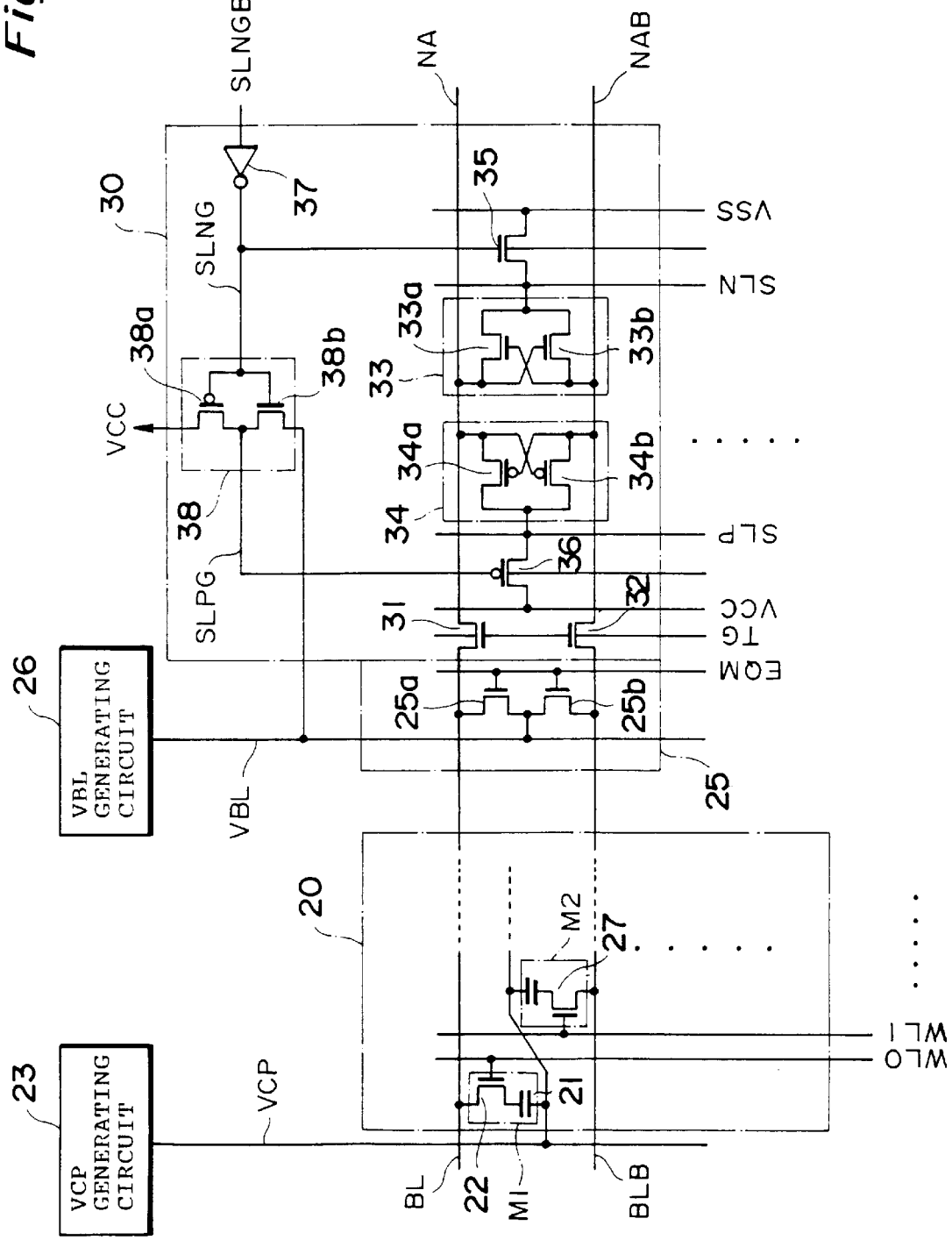
FIG. 3 shows the main circuit of the DRAM of a first embodiment of the present invention.

FIG. 3 shows the main circuit of the DRAM of a first embodiment of the present invention.

As indicated in FIG. 3, there is a plurality of memory cells designated as M1, M2, and so on in a memory cell array 20 of the DRAM. Each memory cell has the same structure and consists of a parallel-plate capacitor 21 and an NMOS device 22. One electrode of the capacitor 21 is connected to the source electrode of the NMOS device 22, while the other electrode of the capacitor is connected to a first reference potential VCP, which is the cell plate potential. The level of this first reference potential VCP is about midway between a first power potential VSS and a second power potential VCC, and is generated by a VCP generating circuit 23.

The drain electrode of the NMOS device 22 in the memory cell M1 shown in FIG. 3 is connected to a bit line BL, while the gate electrode (of the NMOS device 22) is connected to a word line WL0. Similarly, the drain electrode of the NMOS device 27 in the memory cell M2 is connected to a bit line BLB, while the gate electrode (of the NMOS device 27) is connected to a word line WL1. The bit lines BL and BLB that are supplied to the memory cell array 20 are connected to an equalizing circuit 25.

The equalizing circuit 25 is used to supply the same potential level to the bit lines BL and BLB, and consists of NMOS devices 25a and 25b, the source electrodes of which are connected to the second reference potential VBL for the purpose of pre-charging the bit lines. The drain electrodes of the NMOS devices 25a and 25b receive to the bit lines BL and BLB, respectively, and the gate electrodes (of the NMOS's 25a and 25b) are connected to the pre-charging control signal EQM. The level of the second reference potential VBL is about midway between the second power potential VCC and the first power potential VSS, and is generated by a VBL generating circuit 26. A sense circuit 30 is connected to the bit lines BL and BLB.

In the sense circuit 30, the bit lines BL and BLB are connected to sense amplifier nodes NA and NAB by NMOS devices 31 and 32, respectively, which are transfer gates. Further, the gate electrodes of the NMOS devices 31 and 32 receive to the control signal TG. When the control signal TG becomes active, the NMOS devices 31 and 32 are turned on. Consequently, the nodes NA and NAB become connected to the bit lines BL and BLB through the NMOS devices 31 and 32, respectively.

Between the nodes NA and NAB is connected a sense amplifier 33 consisting of two NMOS devices 33a and 33b, the source electrodes of which are connected to each other. Further, between the nodes NA and NAB is connected a second sense amplifier 34 that consists of two PMOS devices 34a and 34b, the source electrodes of which are connected to each other. The node NA is connected to the drain electrodes of the NMOS device 33a and the PMOS device 34a, and to the gate electrodes of the NMOS device 33b and PMOS device 34b. The node NAB is connected to the drain electrode of the NMOS device 33b and PMOS device 34b, and to the gate electrodes of the NMOS device 33a and PMOS device 34a.

The source electrodes of the NMOS devices 33a and 33b are connected to the drain electrode of NMOS device 35, the source electrode of which is connected to the first power potential VSS. The source electrodes of the PMOS devices 34a and 34b are connected to the drain electrode of PMOS device 36, the source electrode of which is connected to the second power potential VCC.

The sense circuit 30 has an activating signal generation circuit that generates the first activating signal SLNG and the second activating signal SLPG. The activating signal generation circuit consists of a first inverter 37 and a second inverter 38. The input signal of the inverter 37 is the sense starting signal SLNGB, which is one of the control signals, and the output signal of the inverter (37) is the first activating signal SLNG. The input signal of the inverter 38 is the first activating signal SLNG, and the output signal (of the inverter 38) is the second activating signal SLPG. The first and second activating signals SLNG and SLPG are logically complementary.

The inverter 38 consists of a PMOS device 38a and an NMOS device 38b. The gate electrodes of the PMOS device 38a and NMOS device 38b receive the activating signal SLNG, while the drain electrodes of the PMOS device 38a and NMOS device 38b are connected together. The source electrode of the PMOS device 38a is connected to the second power potential VCC. The source electrode of the NMOS device 38b is connected to the second reference potential VBL, unlike in a conventional circuit. The output signal of the inverter 37 (the first activating signal SLNG) is provided to the gate of the NMOS device 35, while the output signal of the inverter 38 (the second activating signal SLPG) is provided to the gate of the PMOS device 36.

Figure 4:
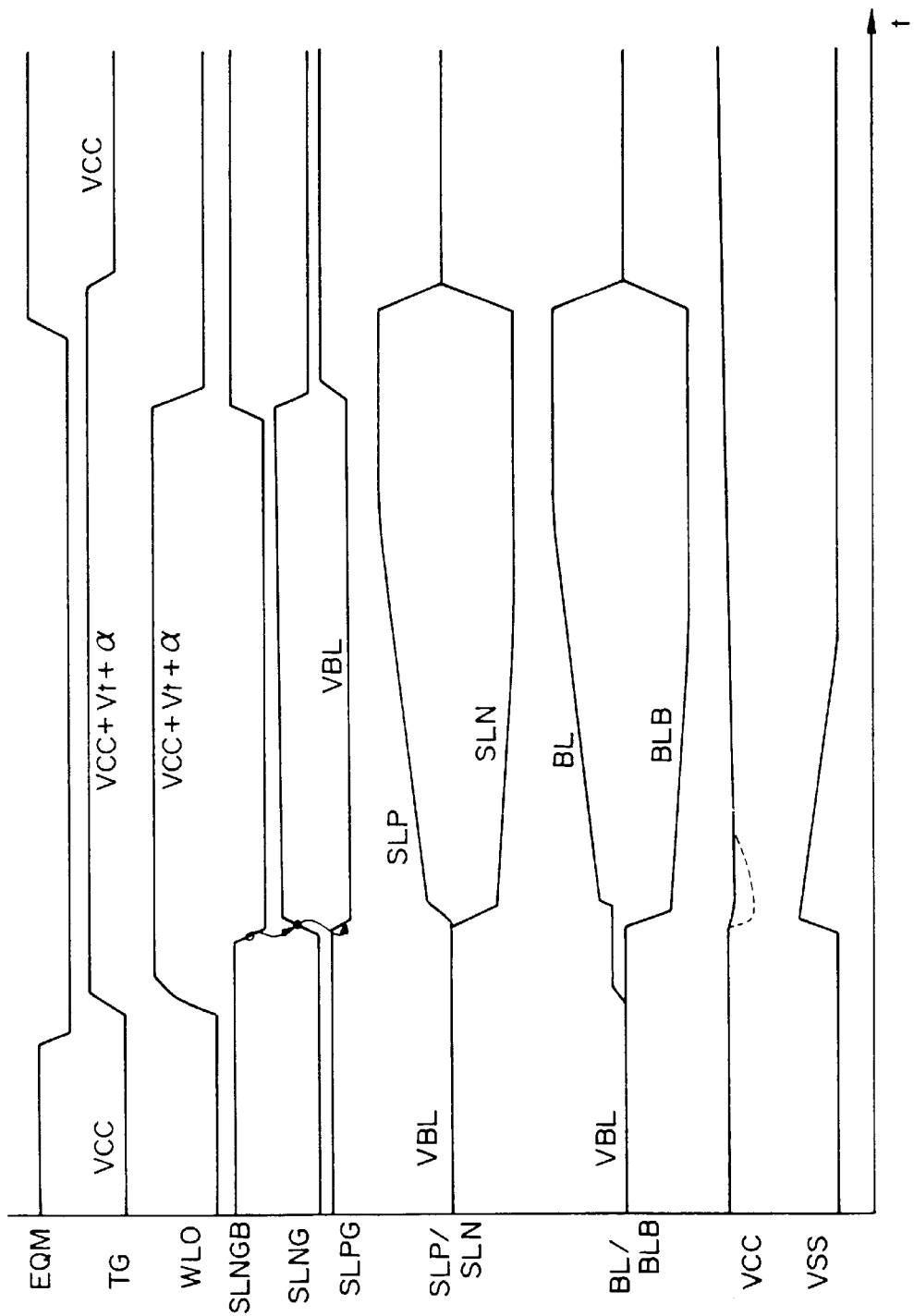
FIG. 4 shows a waveform diagram illustrating the operation of the circuit of the first embodiment.

Only one sense circuit 30 is drawn in FIG. 3 to facilitate understanding, although in an actual DRAM circuit, there is a plurality of bit line pairs that are supplied to the memory cell array 20, and a plurality of sense circuits 30 connected to their corresponding bit line pairs. However, the NMOS device 35, the PMOS device 36, and the inverters 37 and 38 can be shared by many sense circuits FIG. 4 shows a waveform diagram illustrating the operation of the circuit in FIG. 3. The operation of the circuit of the first embodiment will now be described with reference to FIG. 4.

When the control signal EQM goes from "H" level to "L" level, the NMOS devices 25a and 25b in the equalizing circuit 25 both enter an off state, and the bit lines BL and BLB are disconnected from the second reference potential VBL. Now when the potential of word line WL0 reaches a higher potential level (VCC+Vt+a), a small potential difference caused by memory cell data is generated on the bit lines BL and BLB. Further, when the word line WL0 reaches a higher potential level (VCC+Vt+a), the control signal TG rises up to (VCC+Vt+a) and the NMOS devices 31 and 32 are activated. Consequently, the bit lines BL and BLB become connected to the nodes NA and NAB, respectively.

The sense operation starts when the sense starting signal SLNGB falls from "H" level to "L" level. When the sense starting signal SLNGB drops to "L", the inverter 37 causes the first activating signal SLNG to rise from "L" level to "H" level (VCC). As a result, the NMOS device 38b is activated and the second activating signal SLPG falls from "H" level to "L" level. The "L" level of the second activating signal SLPG is the second reference potential VBL, which now flows through the NMOS device 38b.

Thus both the NMOS device 35, the input of which is the "H" level of the activating signal SLNG, and the PMOS device 36, the input of which is the "L" level of the activating signal SLPG, are turned on, and the sense amplifiers 33 and 34 are activated. The small potential difference between the nodes NA and NAB connected to the bit lines BL and BLB is sensed and amplified by the activated sense amplifiers 33 and 34 by charging and discharging the nodes NA and NAB through the PMOS device 36 and NMOS device 35, respectively. Thus, the small potential difference between the bit lines BL and BLB becomes large enough to be stored by the corresponding memory cell.

As described above, an important aspect of the circuit structure of the first embodiment is that the "L" level of the second activating signal SLPG, which is the output of the inverter 38, is the second reference potential VBL (nearly (VSS+VCC)/2), and this second reference potential VBL is provided to the gate electrode of the PMOS device 36. Accordingly, the following benefits (a), (b), and (c) are attained.

(a) When charging and discharging, the conductive resistance of the PMOS device 36 is higher and the voltage drop (of the PMOS device 36) is larger than those of a conventional circuit [RCS1] supplied with the first power potential VSS. Consequently, the voltage drop caused by the parasitic resistance of power supply wirings is decreased, and the operating characteristic margin becomes better than that of the conventional circuit supplied with the first power potential VSS.

(b) The gate potential of the PMOS device 36 is the second reference potential VBL, which is nearly (VSS+VCC)/2. The characteristic of drain current versus source-drain voltage is different from that in a conventional circuit, and the PMOS device 36 acts as a constant current source. Therefore, the bit lines BL and BLB are charged by the constant current source, and the peak current for charging is reduced. Consequently, power noise is reduced.

(c) Since the PMOS device 36 is activated by the second reference potential VBL, which is the pre-charging potential level for the pair of bit lines BL and BLB, the time it takes for the PMOS device 36 to charge the nodes NA and NAB is constant even if the second reference potential VBL changes. The PMOS device 36 selects an adjusted charging current depending on the pre-charged potential of the bit lines BL and BLB. For example, if the pre-charged potential of the bit line NA is δ V (potential difference between bit lines, which occurs at re-distribution of electric charge in a memory cell with electric charge in on bit lines) higher than (VSS+VCC)/2, the volume of pre-charged electrons is less than that of (VSS+VCC)/2. On the other hand, if the "L" level of the second activating signal SLPG becomes δ V higher than (VSS+VCC)/2, the PMOS device 36 activating efficiency for the sense amplifier 33 will be decreased, and the charging current for the bit line BL will be decreased. Consequently, no matter how much the level of the second reference potential VBL changes, charging time is constant.

<Second Embodiment>

Figure 5:
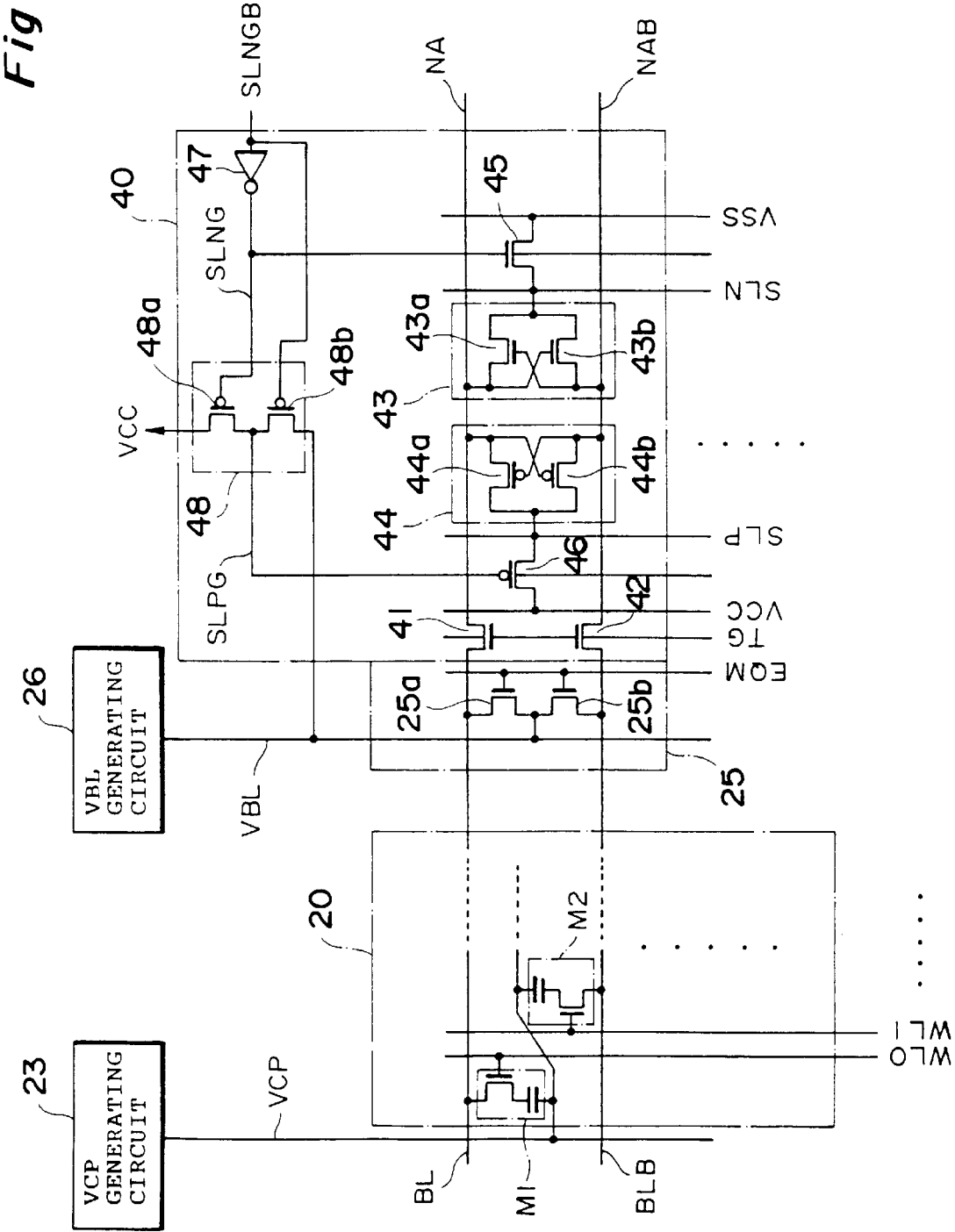
FIG. 5 shows the main circuit of the DRAM of a second embodiment of the present invention.

FIG. 5 shows the main circuit of the DRAM of a second embodiment of the present invention. The naming conventions for the elements in FIG. 5 are the same as for those in FIG. 3. The DRAM circuit of the second embodiment, like that of the first embodiment, has a memory cell array 20, an equalizing circuit 25, a VCP generating circuit 23, a VBL generating circuit 26, all of which are the same as those in the first embodiment, and a sense circuit 40, which differs from that in FIG. 3.

The sense circuit 40 is connected to the bit lines BL and BLB. In the sense circuit 40, the bit lines BL and BLB are connected to the sense amplifier nodes NA and NAB by way of NMOS devices 41 and 42, respectively, which are transfer gates. Additionally, there two sense amplifiers 43 and 44 between the nodes NA and NAB in the sense circuit 40.

The first sense amplifier 43 consists of two NMOS devices 43a and 43b, the source electrodes of which are connected to each other. The second sense amplifier 44 consists of two PMOS devices 44a and 44b, the source electrodes of which are also connected to each other. The node NA is connected to the drain electrodes of the NMOS devices 43a and PMOS device 44a, and to the gate electrodes of the NMOS device 43b and PMOS device 44b. The node NAB is connected to the drain electrodes of the NMOS 43b and PMOS device 44b, and to the gate electrodes of the NMOS 43a and PMOS 44a.

The source electrodes of the NMOS devices 43a and 43b are connected to the drain electrode of NMOS device 45, the source electrode of which is connected to the first power potential VSS. The source electrodes of the PMOS devices 44a and 44b are connected to the drain electrode of PMOS device 46, the source electrode of which is connected to the second power potential VCC.

The sense circuit 40 has an activating signal generation circuit that generates a first activating signal SLNG and a second activating signal SLPG. The activating signal generation circuit consists of a first inverter 47 and a second inverter 48. The input signal of the inverter 47 is the sense starting signal SLNGB, which is one of the control signals, and the output signal (of the inverter 47) is the first activating signal SLNG. The input signal of the inverter 48 is the first activating signal SLNG, and the output signal (of the inverter 48) is the second activating signal SLPG. The first activating signal SLNG and the second activating signal SLPG are logically complementary.

The inverter 48 consists of the PMOS devices 48a and 48b. The gate electrode of the PMOS device 48a receive to the first activating signal SLNG, while the gate electrode of the PMOS device 48b is receive the sense starting signal SLNGB. The drain electrodes of the PMOS device 48a and PMOS device 48b are connected together. The source electrode of the PMOS device 48a is connected to the second power potential VCC. The source electrode of the PMOS device 48b is connected to the second reference potential VBL. The output signal of the inverter 47 (the first activating signal SLNG) is provided to the gate of the NMOS device 45, while the output signal of the inverter 48 (the second activating signal SLPG) is provided to the gate of the PMOS device 46.

Only one sense circuit 40 is drawn in FIG. 5 to facilitate understanding, although in an actual DRAM circuit there is a plurality of bit line pairs that are supplied to the memory cell array 20, and, accordingly, there is a plurality of sense circuits 40 connected to the corresponding bit line pairs. However, the NMOS device 45, the PMOS device 46, and the inverters 47 and 48 can be shared by many sense circuits.

Figure 6:
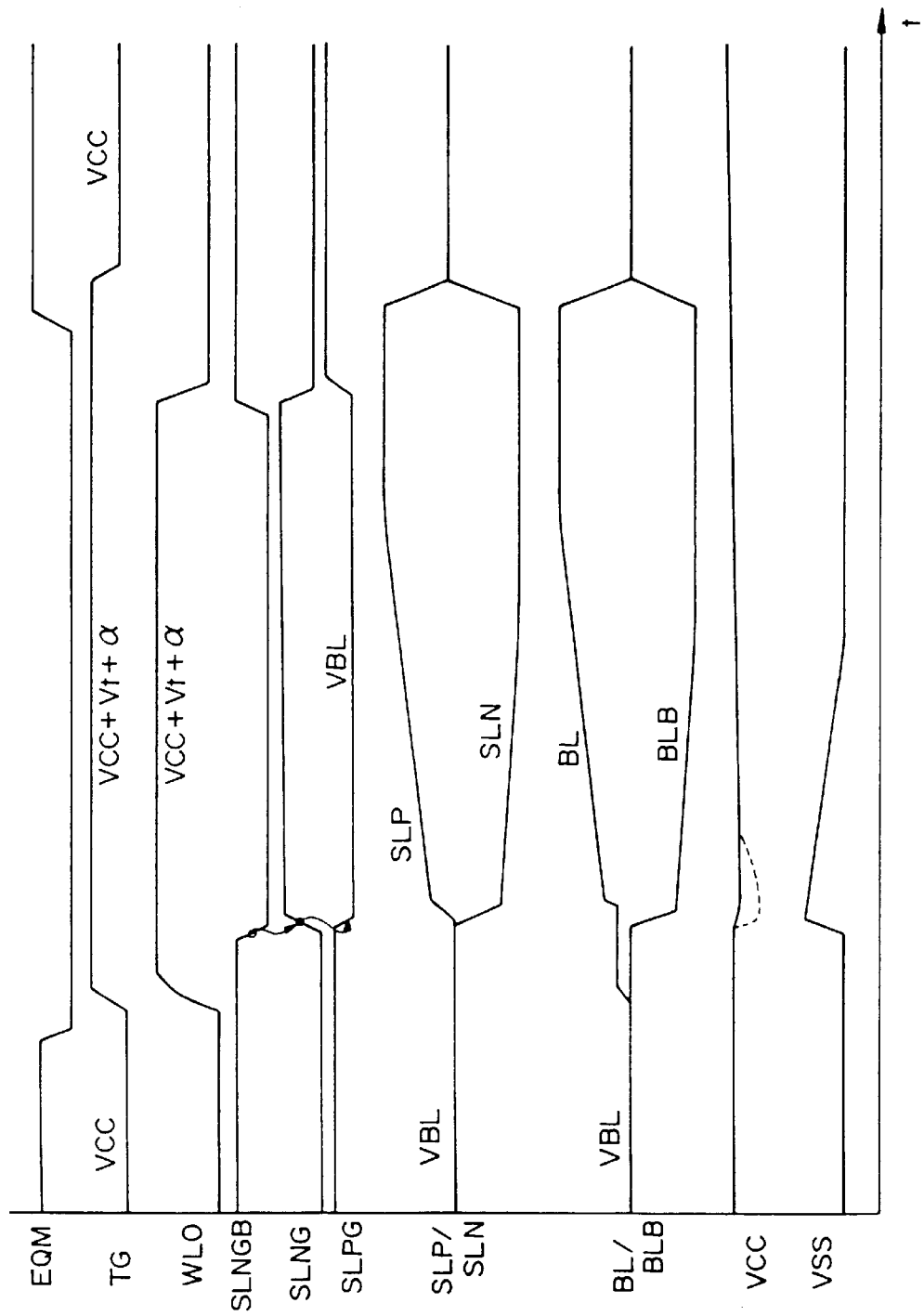
FIG. 6 shows a waveform diagram illustrating the operation of the circuit of the second embodiment.

FIG. 6 is a waveform diagram illustrating operation of the circuit in FIG. 5. The operation of the second embodiment will now be described with reference to FIG. 6. The DRAM operation of the second embodiment is fundamentally the same as that of the first embodiment. The NMOS devices 25a and 25b in the equalizing circuit 25 are cut off when the pre-charging control signal EQM becomes "L". In addition, the NMOS devices 41 and 42 are turned on, and the bit lines BL and BLB are connected to the nodes NA and NAB, respectively. The above operation is the same as that of the first embodiment.

The sense operation starts when the sense starting signal SLNGB falls from "H" level to "L" level. When the sense starting signal SLNGB drops to "L", the first activating signal SLNG is caused to rise from "L" level to "H" level (VCC) by the inverter 47. Further, the PMOS device 48b is turned on and the second activating signal SLPG falls from "H" level to "L" level. The "L" level of the second activating signal SLPG is the second reference potential VBL, which now flows through the PMOS device 48b.

Thus both the NMOS device 45, the input of which is the "H" level of the activating signal SLNG, and the PMOS 46, the input of which is the "L" level of the activating signal SLPG, are turned on, and the sense amplifiers 43 and 44 are activated. The small potential difference between the nodes NA and NAB connected to the bit lines BL and BLB is sensed and amplified by the activated sense amplifiers 43 and 44 by charging and discharging the nodes NA and NAB through the PMOS device 46 and NMOS device 45, respectively. Therefore, the small potential difference between the bit lines BL and BLB becomes large enough to be stored by the corresponding memory cell.

As described above, an important aspect of the circuit structure of the second embodiment is that the "L" level of the second activating signal SLPG, which is set to the second reference potential VBL, is provided to the gate electrode of the PMOS device 46. Consequently, the benefits (a), (b), and (c) of the first embodiment are also attained. Furthermore, the falling time of the second activating signal SLPG is one inverter stage faster than that of a conventional circuit. This is because the PMOS device 48b of the inverter 48 is activated by the sense starting signal SLNGB (rather than by SLNG).

<Third Embodiment>

Figure 7:
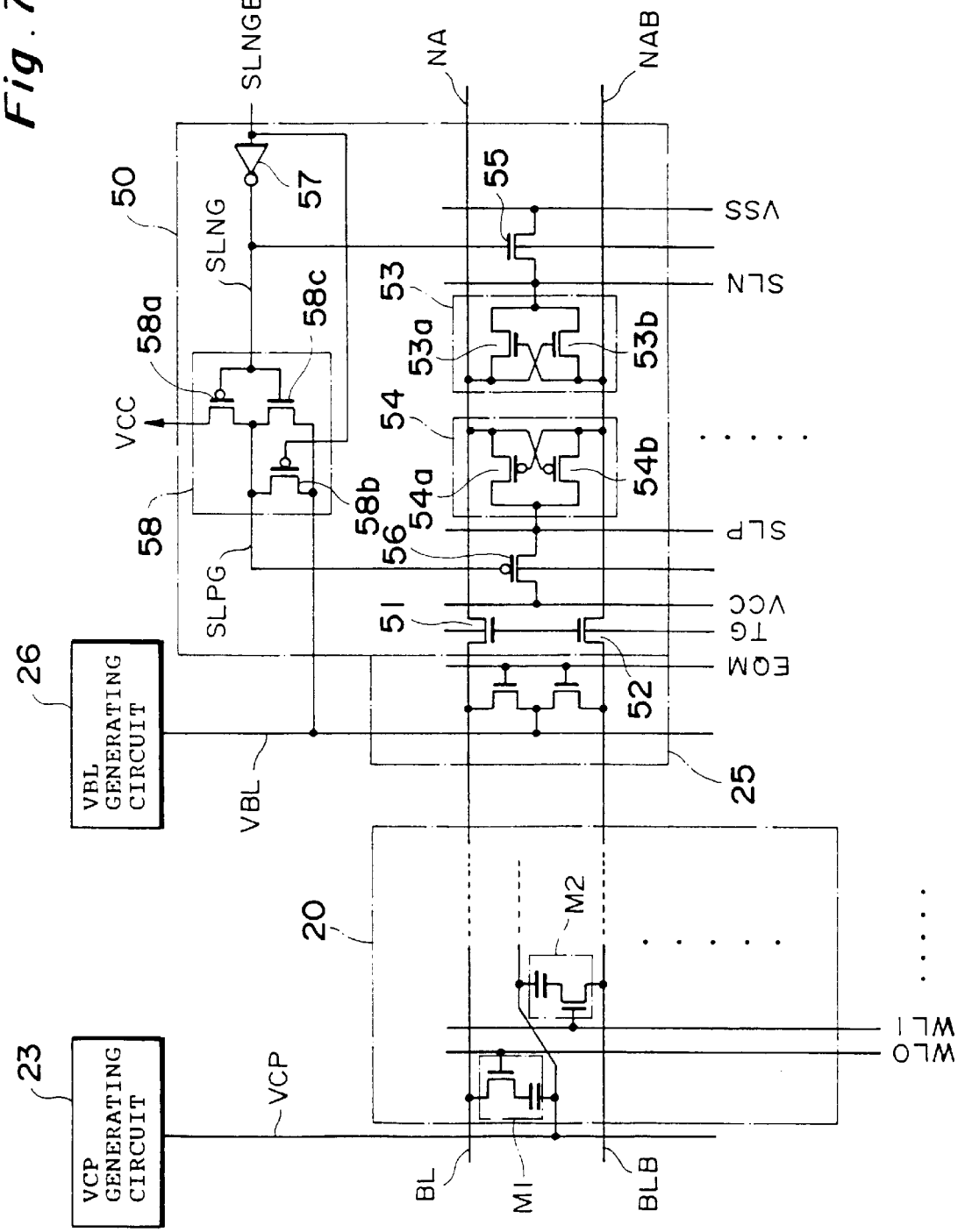
FIG. 7 shows the main circuit of the DRAM of a third embodiment of the present invention.

FIG. 7 shows the main circuit of the DRAM of a third embodiment of the present invention. The naming conventions for the elements in FIG. 3, FIG. 5, and FIG. 7 are the same. The DRAM circuit of the third embodiment, like that of the first and second embodiments, has a memory cell array 20, an equalizing circuit 25, a VCP generating circuit 23, a VBL generating circuit 26, all of which are the same as those in the first embodiment, and a sense circuit 50, which differs from that in FIG. 3 or FIG. 5.

The sense circuit 50 is connected to the bit lines BL and BLB. In the sense circuit 50, the bit lines BL and BLB are connected to the sense amplifier nodes NA and NAB by way of NMOS devices 51 and 52, respectively, which are transfer gates. Additionally, there are two sense amplifiers 53 and 54 between the nodes NA and NAB in the sense circuit 50. The first sense amplifier 53 consists of two NMOS devices 53a and 53b, the source electrodes of which are connected to each other. The second sense amplifier 54 consists of two NMOS devices 54a and 54b, the source electrodes of which are connected to each other.

The node NA is connected to the drain electrodes of the NMOS device 53a and PMOS device 54a, and to the gate electrodes of the NMOS device 53b and PMOS device 54b. The node NAB is connected to the drain electrodes of the NMOS device 53b and PMOS device 54b, and to the gate electrodes of the NMOS device 53a and PMOS device 54a. The source electrodes of the NMOS device 53a and 53b are connected to the drain electrode of NMOS device 55, the source electrode of which is connected to the first power potential VSS. The source electrodes of the PMOS device 54a and 54b are connected to the drain electrode of PMOS device 56, the source electrode of which is connected to the second power potential VCC.

The sense circuit 50, which is different from that in the first and second embodiments, has an activating signal generation circuit that generates a first activating signal SLNG and a second activating signal SLPG. The activating signal generation circuit consists of a first inverter 57 and a second inverter 58. The input signal of the inverter 57 is the sense starting signal SLNGB, which is one of the control signals, and the output signal of the inverter 57 is the first activating signal SLNG. The input signal of the inverter 58 is the first activating signal SLNG and the output signal of the inverter 58 is the second activating signal SLPG. The first activating signal SLNG and the second activating signal SLPG are logically complementary. The inverter 58 consists of a PMOS device 58a, a PMOS device 58b and an NMOS device 58c.

The gate electrodes of the PMOS device 58a and the NMOS device 58c are receive to the first activating signal SLNG, while the gate electrode of the PMOS device 58b receives the sense starting signal SLNGB. The drain electrodes of the PMOS device 58a, PMOS device 58b, and NMOS device 58c are connected together. The source electrode of the PMOS device 58a is connected to the second power potential VCC. The source electrodes of the PMOS device 58b and NMOS device 58c are connected to the second reference potential VBL. The output signal of the inverter 57 (the first activating signal SLNG) is provided to the gate of the NMOS device 55, while the output signal of the inverter 58 (the second activating signal SLPG) is provided to the gate of the PMOS device 56.

Only one sense circuit 50 is drawn in FIG. 7 to facilitate understanding, although there is a plurality of sense circuits connected to a plurality of bit line pairs in an actual DRAM circuit.

Figure 8:
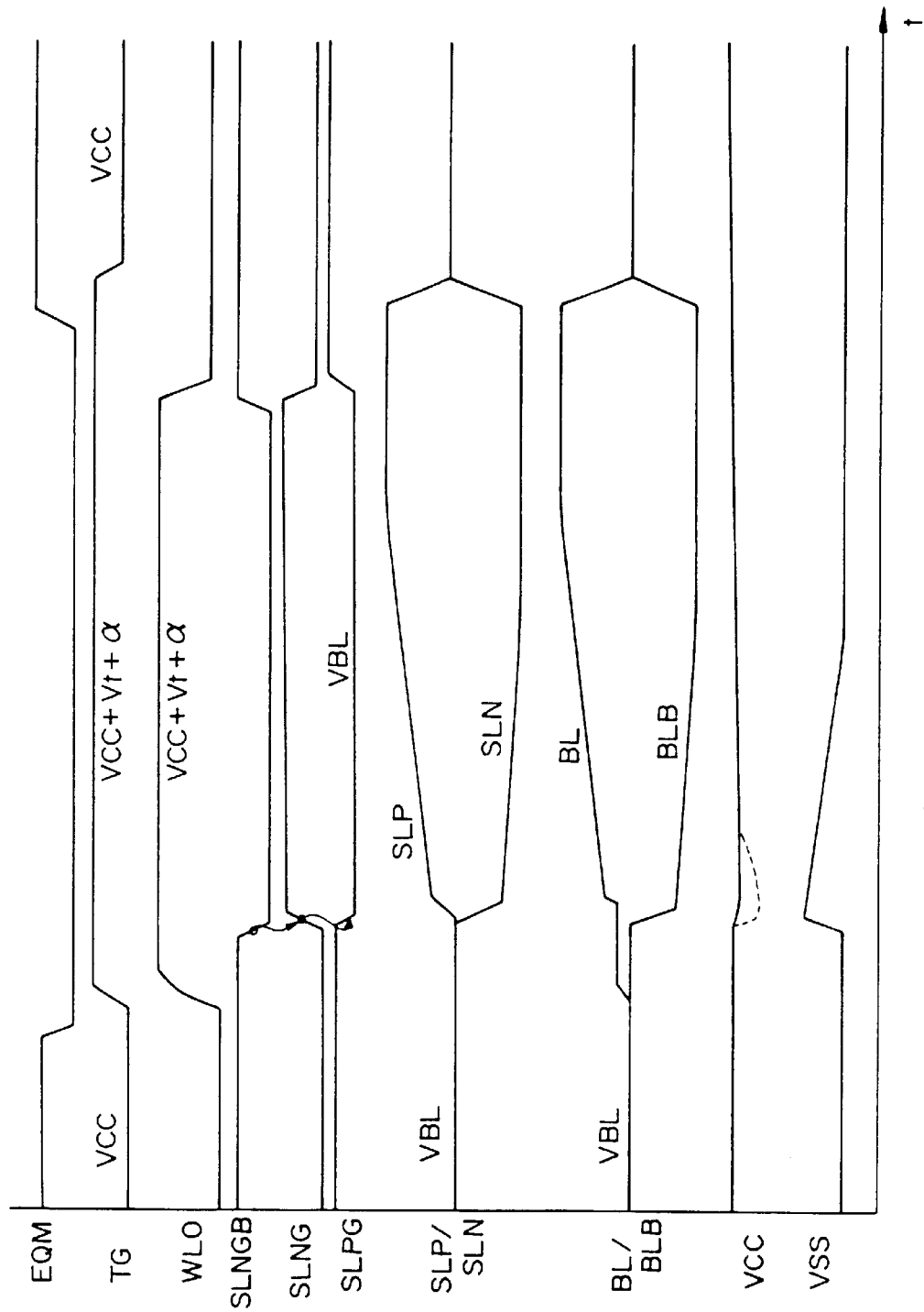
FIG. 8 shows a waveform diagram illustrating the operation of the circuit of the third embodiment.

FIG. 8 is a waveform diagram illustrating the operation of the circuit in FIG. 7. The operation of the circuit in FIG. 7 will now be described with reference to FIG. 8.

The DRAM behavior of the third embodiment is fundamentally the same as that of the first and second embodiments. The NMOS devices 25a and 25b in the equalizing circuit 25 are cut off when the pre-charging control signal EQM becomes "L". In addition, the NMOS devices 51 and 52 are turned on and the bit lines BL and BLB become connected to the nodes NA and NAB, respectively. The above operation is the same as that of the first and second embodiments. The sense operation starts when the sense starting signal SLNGB falls from "H" level to "L" level. When the sense starting signal SLNGB becomes "L", the first activating signal SLNG is caused to rise from "L" level to "H" level (VCC) by the inverter 57. Further, the PMOS device 58b is turned on and the second activating signal SLPG falls from "H" level to "L" level. The NMOS device 58c is also activated, although this happens after the activation of the PMOS device 58b because of the propagation delay of the inverter 57. The activated NMOS device 58c stabilizes the level of the second activating signal SLPG, and the "L" level of the second activating signal SLPG is fixed to the second reference potential level VBL.

Thus, both the NMOS device 55, the input of which is the "H" level of the activating signal SLNG, and the PMOS device 56, the input of which is the "L" level of the activating signal SLPG, are turned on and the sense amplifiers 53 and 54 are activated. The small potential difference between the nodes NA and NAB connected to the bit lines BL and BLB is sensed and amplified by the activated sense amplifiers 53 and 54 by charging and discharging the nodes NA and NAB through the PMOS device 56 and NMOS device 55, respectively. Therefore the small potential difference between the bit lines BL and BLB becomes large enough to be stored by the corresponding memory cell.

As described above, an important aspect of the circuit structure of the third embodiment is that the "L" level of the second activating signal SLPG, which is set to the second reference potential VBL ((VSS+VCC)/2), is provided to the gate electrode of the PMOS device 56. Consequently, the benefits (a) and (b) of the first and second embodiments are also attained. In addition, the falling time of the second activating signal SLPG is one inverter stage faster than that of a conventional circuit, since the PMOS device 58b of the inverter 58 is activated by the sense starting signal SLNGB. Furthermore, the NMOS transistor 58c of the inverter 58 stabilizes the level of the second activating signal SLPG, and the "L" level of the second activating signal SLPG is fixed to the second reference potential level VBL.

<Fourth Embodiment>

Figure 9:
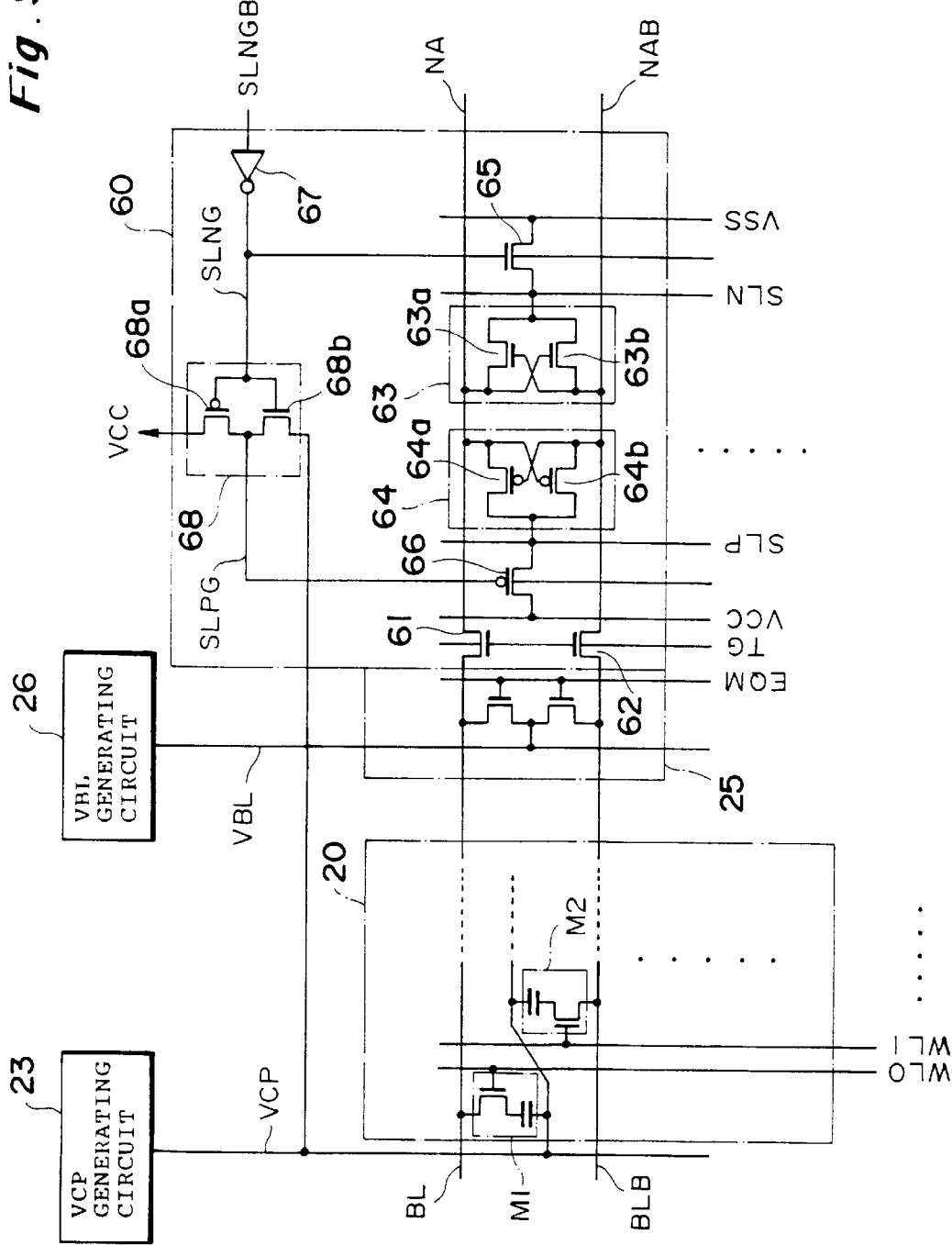
FIG. 9 shows the main circuit of the DRAM of a fourth embodiment of the present invention.

FIG. 9 shows the main circuit of the DRAM of a fourth embodiment of the present invention. The naming conventions for the elements in this embodiment are the same as those of the embodiments presented earlier (FIG. 3, FIG. 5, and FIG. 7). However, whereas the electric potential of the second activating signal SLPG in the first embodiment is the second reference potential VBL, the electric potential of the activating signal (SLPG) in this embodiment is the first reference potential VCP.

The DRAM circuit of the fourth embodiment consists of a memory cell array 20, an equalizing circuit 25, a VCP generating circuit 23, a VBL generating circuit 26, and a sense circuit 60, to which the first reference potential VCP is provided.

The sense circuit 60, which has almost same structure as the sense circuit in FIG. 3, is connected to the bit lines BL and BLB. In the sense circuit 60, the bit lines BL and BLB are connected to the sense amplifier nodes NA and NAB by NMOS devices 61 and 62, respectively, which are transfer gates. In addition, there are two sense amplifiers 63 and 64 between the nodes NA and NAB in the sense circuit 60. The first sense amplifier 63 consists of two NMOS devices 63a and 63b, the source electrodes of which are connected to each other. The second sense amplifier 64 consists of two PMOS devices 64a and 64b, the source electrodes of which are connected to each other. The node NA is connected to the drain electrodes of the NMOS device 63a and PMOS device 64a, and to the gate electrodes of the NMOS device 63b and PMOS device 64b. The node NAB is connected to the drain electrodes of the NMOS device 63b and PMOS device 64b, and the gate electrodes of the NMOS device 63a and PMOS device 64a. The source electrodes of the NMOS devices 63a and 63b are connected to the drain electrode of NMOS device 65, the source electrode of which is connected to the first power potential VSS. The source electrodes of the PMOS devices 64a and 64b are connected to the drain electrode of the PMOS device 66, the source electrode of which is connected to the second power potential VCC.

The sense circuit 60 has an activating signal generation circuit which generates a first activating signal SLNG and a second activating signal SLPG. The activating signal generation circuit consists of a first inverter 67 and a second inverter 68. The input signal of the inverter 67 is the sense starting signal SLNGB, which is one of the control signals, and the output signal of the inverter 67 is the first activating signal SLNG. The input signal of the inverter 68 is the first activating signal SLNG, and the output signal of the inverter 68 is the second activating signal SLPG. The first activating signal SLNG and the second activating signal SLPG are logically complementary.

The inverter 68 consists of a PMOS device 68a and an NMOS device 68b. The gate electrodes of the PMOS device 68a and NMOS device 68b receive the activating signal SLNG, while the drain electrodes of the PMOS device 68a and NMOS device 68b are connected together. The source electrode of the PMOS device 68a is connected to the second power potential VCC. The source electrode of the NMOS device 68b is connected to the first reference potential VCP. The output signal of the inverter 67 (the first activating signal SLNG) is provided to the gate of the NMOS device 65, while the output signal of the inverter 68 (the second activating signal SLPG) is provided to the gate of the PMOS device 66.

Figure 10:
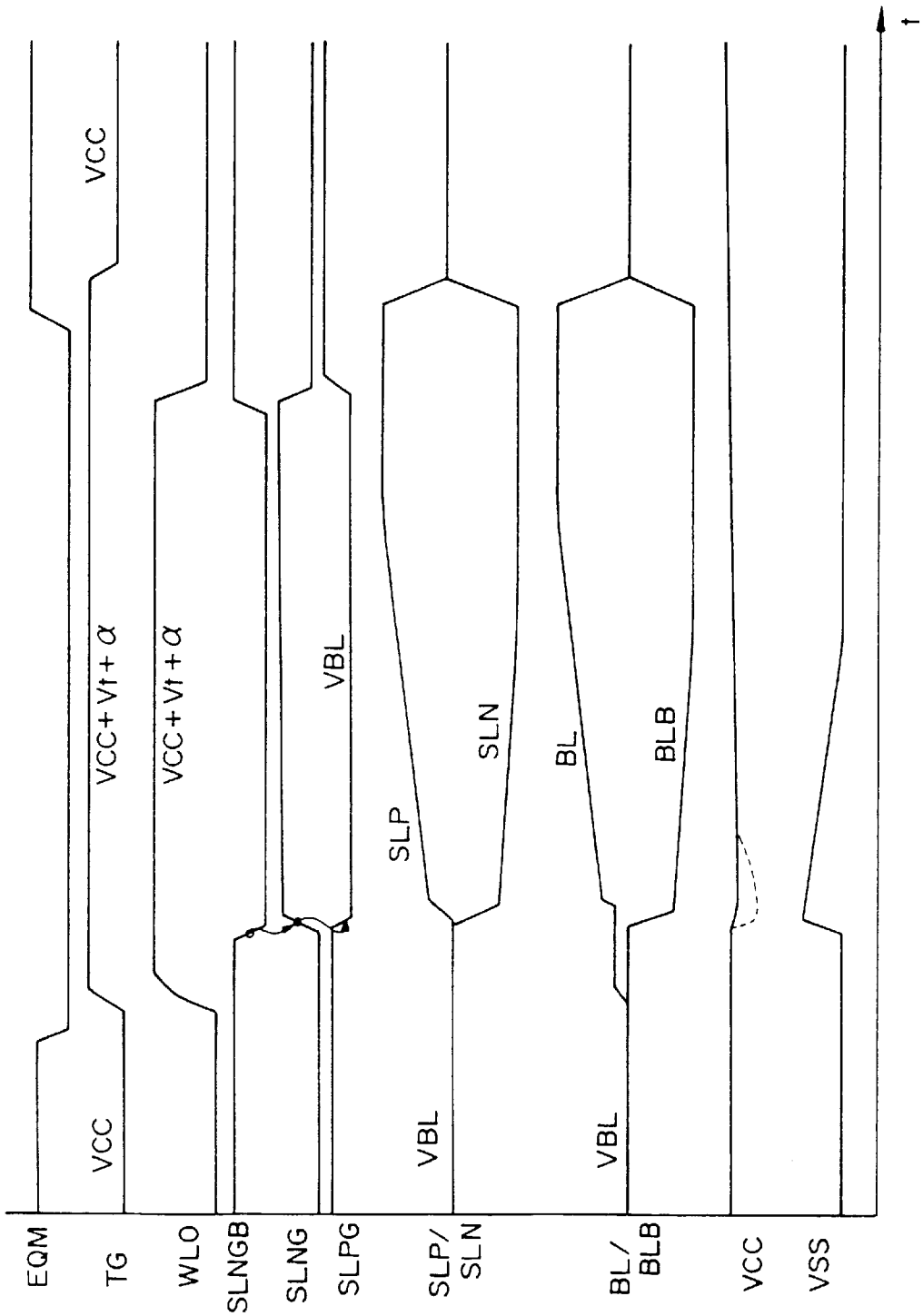
FIG. 10 shows a waveform diagram illustrating the operation of the circuit of the fourth embodiment.

FIG. 10 is a waveform diagram illustrating the operation of the circuit in FIG. 9.

In this embodiment, the source electrode of the NMOS device 68b in the inverter 68 is connected to the first reference potential VCP (instead of the second reference potential VBL), which is nearly (VSS+VCC)/2. Therefore, since the electric potential of the second activating signal SLPG is the same as that in FIG. 4, the operation of this circuit is the same as that described in the first embodiment.

Finally, since in the circuit structure of the fourth embodiment, the source electrode of the NMOS device 68 is connected to the first reference potential VCP, benefit (c) of the first embodiment cannot be attained, although the benefits (a) and (b) are achieved.

<Fifth Embodiment>

Figure 11:
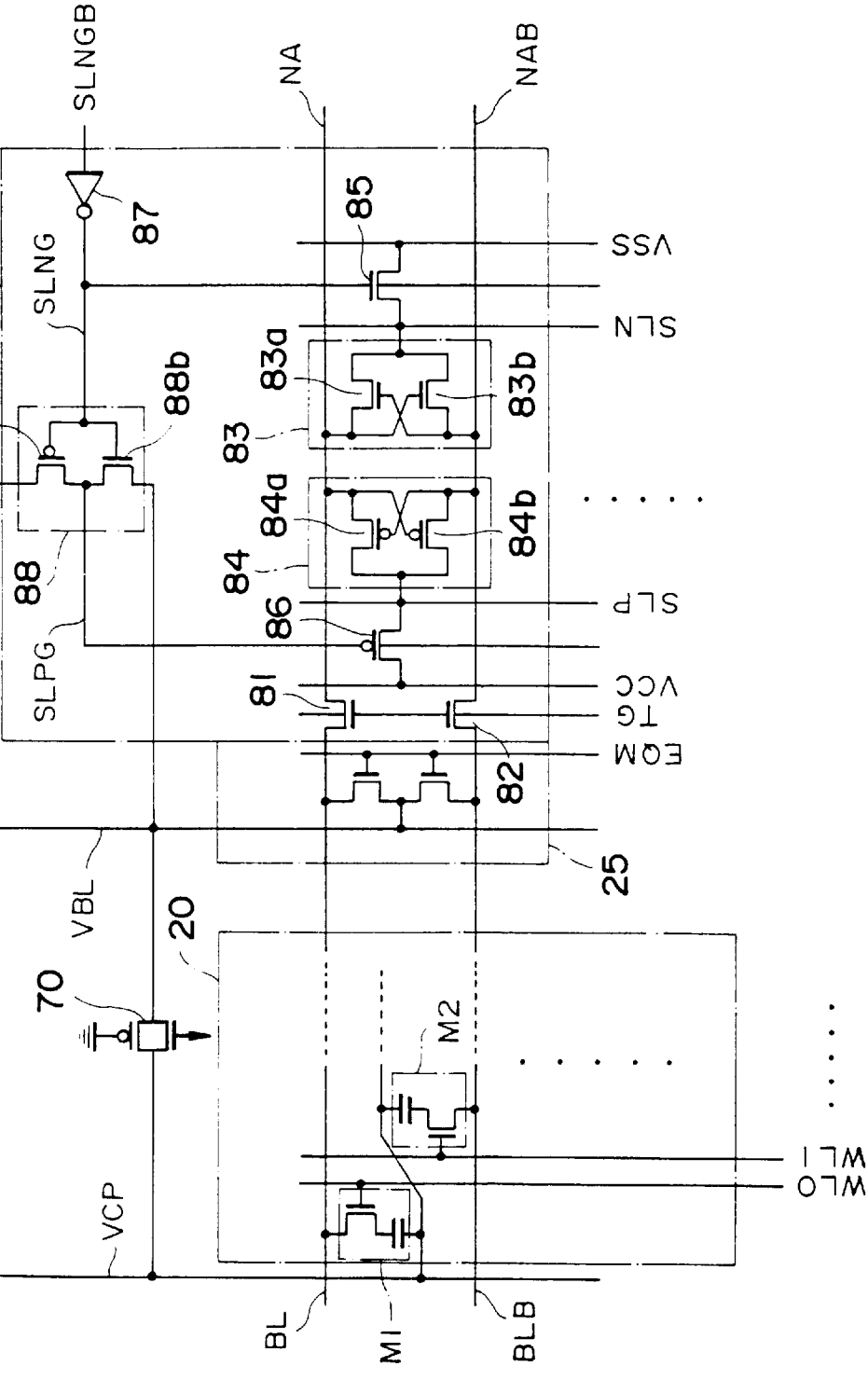
FIG. 11 shows the main circuit of the DRAM of a fifth embodiment of the present invention.

FIG. 11 shows the main circuit of the DRAM of a fifth embodiment of the present invention. The naming conventions for the elements are the same as those in FIG. 3, FIG. 5, FIG. 7, and FIG. 9. It is clear from the fourth embodiment that power noise reduction can be realized whether the first reference potential VCP or the second reference potential VBL is connected to the electric potential of the second activating signal. In this fifth embodiment, a connecting circuit 70 (e.g., a transfer gate) that connects the first reference potential VCP and the second reference potential VBL will be described.

At first, however, the circuit structure of the fifth embodiment is described. This circuit has a memory cell array 20, an equalizing circuit 25, a VCP generating circuit 23, and a VBL generating circuit 26, all of which are the same circuits found in the first through fourth embodiments. The connecting circuit 70 is used to connect the first reference potential VCP and the second reference potential VBL, which occurs when the connecting circuit 70 is activated.

A sense circuit 80 is connected to the bit lines BL and BLB. In the sense circuit 80, the bit lines BL and BLB are connected to the sense amplifier nodes NA and NAB by way of NMOS devices 81 and 82, respectively, which are transfer gates. Additionally, there are two sense amplifiers 83 and 84 between the nodes NA and NAB in the sense circuit 80. The first sense amplifier 83 consists of two NMOS devices 83a and 83b, the source electrodes of which are connected to each other. The second sense amplifier 84 consists of two PMOS devices 84a and 84b, the source electrodes of which are also connected to each other.

The node NA is connected to the drain electrodes of the NMOS device 83a and PMOS device 84a, and to the gate electrodes of the NMOS device 83b and PMOS device 84b. The node NAB is connected to the drain electrodes of the NMOS device 83b and PMOS device 84b, and to the gate electrodes of the NMOS device 83a and PMOS device 84a. The source electrodes of the NMOS devices 83a and 83b are connected to the drain electrode of NMOS device 85, the source electrode of which is connected to the first power potential VSS. The source electrodes of the PMOS devices 84a and 84b are connected to the drain electrode of PMOS device 86, the source electrode of which is connected to the second power potential VCC.

The sense circuit 80 has an activating signal generation circuit which generates a first activating signal SLNG and a second activating signal SLPG. The activating signal generation circuit consists of a first inverter 87 and a second inverter 88. The input signal of the inverter 87 is the sense starting signal SLNGB, which is one of the control signals, and the output signal of the inverter 87 is the first activating signal SLNG. The input signal of the inverter 88 is the first activating signal SLNG, and the output signal of the inverter 88 is the second activating signal SLPG. The first activating signal SLNG and the second activating signal SLPG are logically complementary.

The inverter 88 consists of a PMOS device 88a and an NMOS device 88b.

The gate electrodes of the PMOS device 88a and NMOS device 88b receive the activating signal SLNG, while the drain electrodes of the PMOS device 88a and NMOS device 88b are connected together. The source electrode of the PMOS device 88a is connected to the second power potential VCC. The source electrode of the NMOS device 88b is connected to the first reference potential VCP and second reference potential VBL. The output signal of the inverter 87 (the first activating signal SLNG) is provided to the gate of the NMOS device 85 while the output signal of the inverter 88 (the second activating signal SLPG) is provided to the gate of the PMOS device 86.

Figure 12:
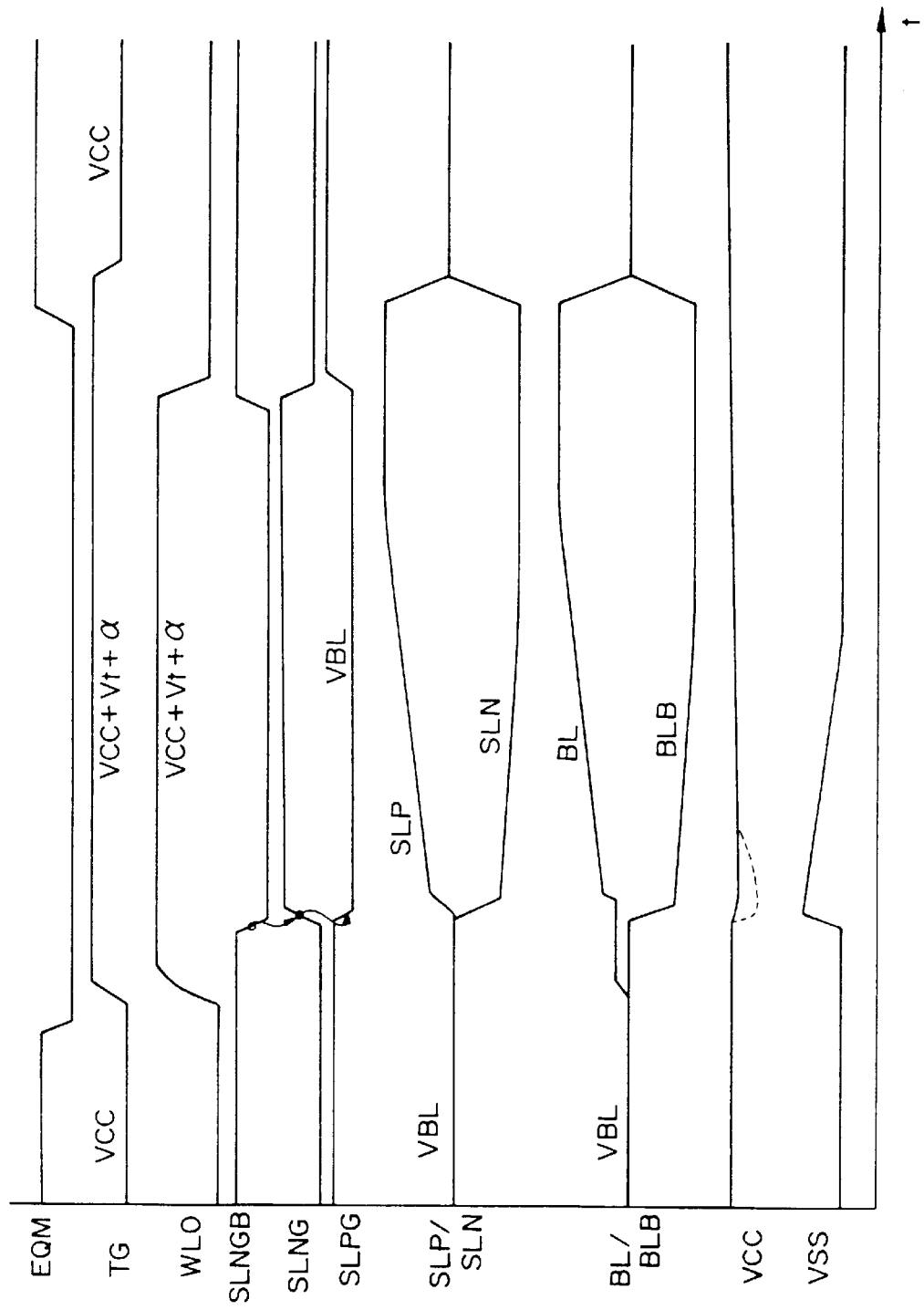
FIG. 12 shows a waveform diagram illustrating the operation of the circuit of the fifth embodiment.

FIG. 12 is a waveform diagram illustrating the operation of the circuit in FIG. 11. The source electrode of the NMOS device 88b in the inverter 88 is connected to the first reference potential VCP and to the second reference potential VBL, both of which are nearly (VSS+VCC)/2. Therefore, since the electric potential of the second activating signal SLPG is the same as that in FIG. 4, the operation of this circuit is the same as that of the first embodiment.

Since in the circuit structure of the fifth embodiment the source electrode of the NMOS device 88 is connected to both the first and second reference potentials VCP and VBL, the benefits (a), (b), and (c) of the first embodiment are attained.

<Sixth Embodiment>

Figure 13:
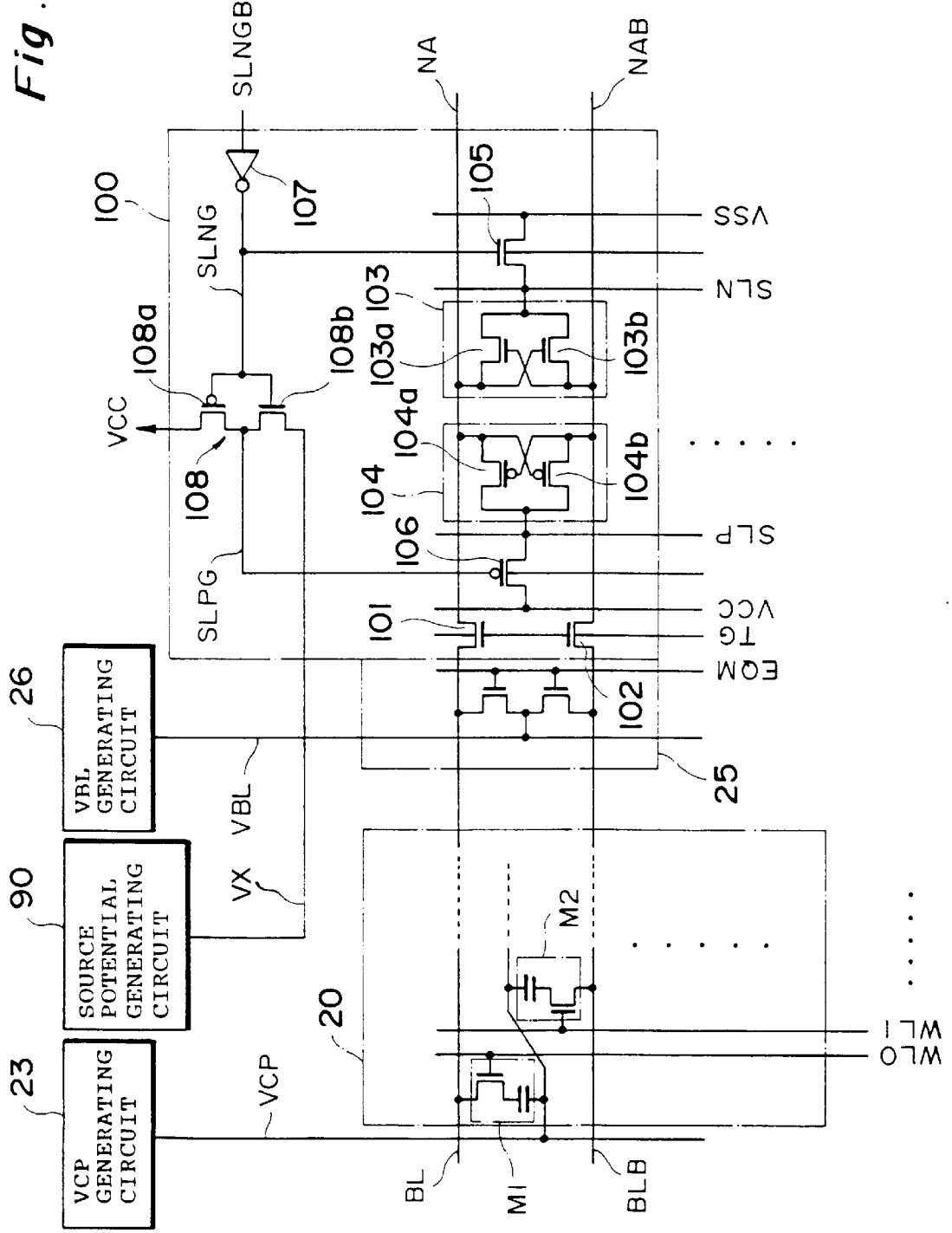
FIG. 13 shows the main circuit of the DRAM of a sixth embodiment of the present invention.

FIG. 13 shows the main circuit of the DRAM of a sixth embodiment of the present invention. The naming conventions for the elements are the same as for those in FIG. 3, FIG. 5, FIG. 7, FIG. 9, and FIG. 11.

In the first through fifth embodiments, the electric potential of the second activating signal SLPG is either the first reference potential VCP or the second reference potential VBL. In the sixth embodiment, however, a source potential generating circuit 90 that provides a third reference potential VX, is introduced, and the "L" level of the second activating signal SLPG is this third reference potential VX (which is independent of the first and second reference potentials VCP and VBL).

As in the first through fifth embodiments, the DRAM circuit of the sixth embodiment has a memory cell array 20, an equalizing circuit 25, a VCP generating circuit 23, and a VBL generating circuit 26, which are the same circuits as those in the earlier embodiments. The sense circuit 100 has almost same structure as that in FIG. 3, and is connected to the bit lines BL and BLB. In the sense circuit 100, the bit lines BL and BLB are connected to the sense amplifier nodes NA and NAB by NMOS devices 101 and 102, respectively, which are transfer gates. Additionally, there are two sense amplifiers 103 and 104 between the nodes NA and NAB in the sense circuit 100. The first sense amplifier 103 consists of two NMOS devices 103a and 103b, the source electrodes of which are connected to each other, while the second sense amplifier 104 consists of two PMOS devices 104a and 104b, the source electrodes of which are connected to each other. The node NA is connected to the drain electrodes of the NMOS device 103a and PMOS device 104a, and to the gate electrodes of the NMOS device 103b and PMOS device 104b. The node NAB is connected to the drain electrodes of the NMOS device 103b and PMOS device 104b, and to the gate electrodes of the NMOS device 103a and PMOS device 104a. The source electrodes of the NMOS devices 103a and 103b are connected to the drain electrode of NMOS device 105, the source electrode of which is connected to the first power potential VSS. The source electrodes of the PMOS devices 104a and 104b are connected to the drain electrode of PMOS device 106, the source electrode of which is connected to the second power potential VCC.

The sense circuit 100 has an activating signal generation circuit which generates a first activating signal SLNG and a second activating signal SLPG. The activating signal generation circuit consists of a first inverter 107 and a second inverter 108. The input signal of the inverter 107 is the sense starting signal SLNGB, which is one of the control signals, while the output signal of the inverter 107 is the first activating signal SLNG. The input signal of the inverter 108 is the first activating signal SLNG, and the output signal of the inverter 108 is the second activating signal SLPG. The first activating signal SLNG and the second activating signal SLPG are logically complementary.

The inverter 108 consists of a PMOS devices 108a and an NMOS device 108b. The gate electrodes of the PMOS device 108a and the NMOS device 108b receive the activating signal SLNG, while the drain electrodes of the PMOS device 108a and the NMOS device 108b are connected together. The source electrode of the PMOS device 108a is connected to the second power potential VCC. The source electrode of the NMOS device 108b is connected to the third reference potential VX, which is supplied by the source potential generating circuit 90. The output signal of the inverter 107 (the first activating signal SLNG) is provided to the gate of the NMOS device 105, while the output signal of the inverter 108 (the second activating signal SLPG) is provided to the gate of the PMOS device 106.

Figure 14:
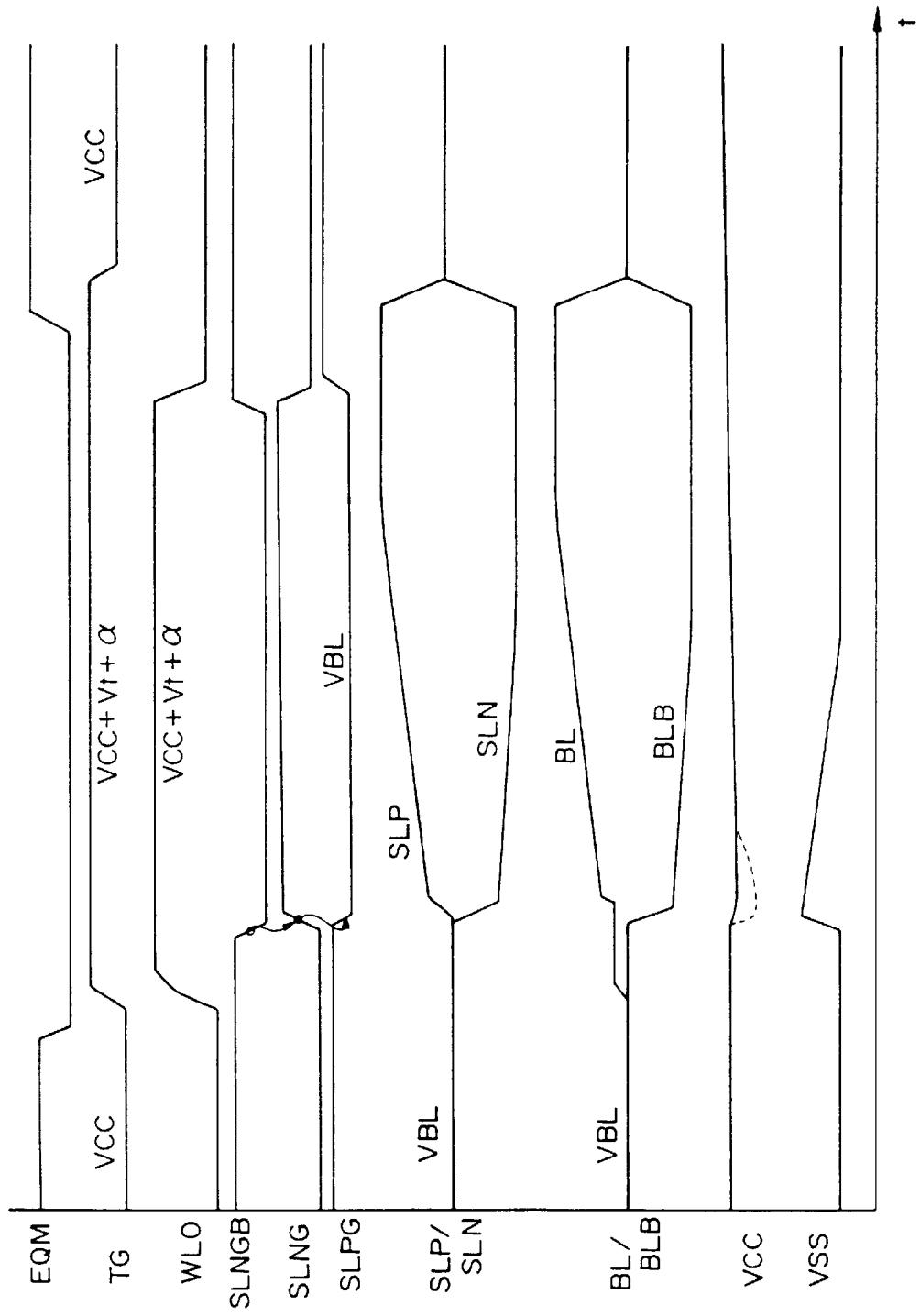
FIG. 14 shows a waveform diagram illustrating the operation of the circuit of the sixth embodiment.

FIG. 14 shows a waveform diagram illustrating the operation of the circuit in FIG. 13. As stated earlier, the source potential generating circuit 90 is introduced into the circuit of the sixth embodiment, and the source electrode of the NMOS device 108b is connected to the third reference potential VX. The third reference potential VX can be changed independently of the first and second reference potentials VBL and VCP. Therefore, the DRAM circuit of the sixth embodiment can be realized by appropriate adjustments of the third reference potential level. The DRAM circuit of the sixth embodiment thus attains the benefits (a) and (b) of the first embodiment.

It will be noted that for the present invention, many other circuit variants are possible; that is, realizations are not limited to the embodiments described above.

For instance, the internal circuit structure for the memory cell array 20 or the equalizing circuit 25 can be changed to another circuit structure, and is therefore not limited to the structure described in the first through sixth embodiments.

The sense circuit 60 in the fourth embodiment is connected the first reference potential VCP (unlike the sense circuit 30 in he first embodiment, which is connected to the second reference potential VBL). The first reference potential VCP can likewise be applied to the sense circuits 40 and 50 in the second and third embodiments while attaining the same benefits.

As described in the first through sixth embodiments, the active potential level of the second activating signal, which activates the PMOS transistors 36, 46, 56, 66, 86, and 106 in the respective activating signal generation circuits, is midway between the first and second power potentials. Therefore, the operating region of the PMOS transistor, the input of which is the second activating signal with midway potential level, is different from that of a conventional circuit, the input of which is the second power potential. The conductive resistance of the PMOS transistor in the present invention is higher than that of the PMOS transistor in conventional circuits. Consequently, the peak current when charging and discharging the bit lines will be reduced, power noise will be decreased, and a decrease of operating margin of a peripheral circuit will be prevented.

What is claimed is:

1. A semiconductor memory device, comprising:
   a sense amplifier which senses an electric charge in a memory cell;
   a switching circuit which switches, according to a control signal, an activating current flowing between the sense amplifier and an activating voltage source which applies activating voltages to the sense amplifier, such that a level of the activating current corresponds to a value of the control signal,
   wherein the activating voltages include a first voltage and a second voltage; and
   a control signal output circuit which provides the control signal to the switching circuit, wherein one value of the control signal is a control voltage that is between the first voltage and the second voltage,
   wherein the first voltage is one of a positive actuating potential and a ground potential, and the second voltage is the other of the positive actuating potential and the ground potential, and
   wherein the control voltage is about midway between the first voltage and the second voltage.

2. The device as set forth in claim 1, wherein
   if the control signal has a value about equal to the first voltage, the activating current is inhibited; and
   if the control signal has a value about equal to the second voltage, the activating current is enabled.

3. The device as set forth in claim 1, wherein the control signal output circuit includes a first transistor for providing the control signal having value about equal to the first voltage, and a second transistor for providing the control voltage.

4. The device as set forth in claim 3, wherein the first transistor is a first MOS transistor, and the second transistor is a second MOS transistor.

5. The device as set forth in claim 4, wherein the first MOS transistor is one of a PMOS device transistor and an NMOS device transistor, and the second MOS transistor is the other of a PMOS transistor and an NMOS transistor, and wherein the first and second transistors are alternatively turned on in response to a switching signal.

6. The device as set forth in claim 1, wherein the control signal output circuit includes:
   a first transistor for providing the control signal having a value about equal to the first voltage;
   a second transistor for generating the control signal having the control voltage;
   a buffering circuit which receives and buffers a switching signal; and
   a third transistor which receives the control signal from the second transistor and provides the control signal to the switching circuit;
   wherein
   the first and second transistors are alternatively turned on in response to the buffered switching signal; and
   the third transistor is turned on with the second transistor, in response to the unbuffered switching signal.

7. The device as set forth in claim 4, wherein
   the first MOS transistor is one of a PMOS transistor and an NMOS transistor,
   the second MOS transistor is the one of a PMOS transistor and an NMOS transistor,
   the first and second transistors are alternatively turned on in response to a first switching signal applied to the first transistor and a second switching signal applied to the second transistor, and
   the second switching signal is an inverse of the first switching signal.

8. The device as set forth in claim 1, wherein the switching circuit includes a MOS transistor having a gate to which the control signal is applied.

9. The device as set forth in claim 1, further comprising a reference voltage generating circuit which provides a reference voltage to the control signal output circuit to set the value of the control signal provided by the control signal output circuit.

10. The device as set forth in claim 9, wherein the reference voltage generating circuit is a precharging voltage generating circuit, and the reference voltage is also a precharging voltage for precharging bit lines connected to the memory cell.

11. The device as set forth in claim 9, wherein the reference voltage generating circuit is a memory cell voltage generating circuit, and the reference voltage is also a memory cell voltage for charging the memory cell.

12. The device as set forth in claim 1, further comprising:
- a precharging voltage generating circuit which generates a precharging voltage for precharging bit lines connected to the memory cell and which provides the precharging voltage to the control signal output circuit to set the value of the control signal provided by the control signal output circuit;
- a memory cell voltage generating circuit which generates a memory cell voltage for charging the memory cell and which provides the memory cell voltage to the control signal output circuit to set the value of the control signal provided by the control signal output circuit; and
- a connection circuit connecting the precharging voltage generating circuit and the memory cell voltage generating circuit together.

13. The device as set forth in claim 12, wherein the connection circuit includes a PMOS transistor having a gate to which a ground potential is applied, and an NMOS transistor having a gate to which the first voltage is applied.

14. A dynamic random access memory, comprising:
- a memory cell which stores an electric charge therein as data;
- a sense amplifier which senses the electric charge;
- a switching circuit which switches, according to a control signal, an activating current flowing between the sense amplifier and an activating voltage source which applies activating voltages to the sense amplifier, such that a level of the activating current corresponds to a value of the control signal, wherein the activating voltages include a first voltage and a second voltage; and
- a control signal output circuit which provides the control signal to the switching circuit, wherein one value of the control signal is a control voltage that is between the first voltage and the second voltage;
- wherein if the control signal is about equal to the first voltage, the level of the activating current is maximized, and if the control signal is about equal to the second voltage, the level of the activating current is minimized,
- wherein the first voltage is one of a positive actuating potential and a ground potential, and the second voltage is the other of the positive actuating potential and the ground potential, and
- wherein the control voltage is about midway between the first voltage and the second voltage.

15. A sense circuit for a dynamic random access memory having a memory cell for storing an electric charge therein as data, comprising:
- a sense amplifier which senses the electric charge;
- a switching circuit which switches, according to a control signal, an activating current flowing between the sense amplifier and an activating voltage source which applies activating voltages to the sense amplifier, such that a level of the activating current corresponds to a value of the control signal, wherein the activating voltages include a first voltage and a second voltage; and
- a control signal output circuit which provides the control signal to the switching circuit, wherein one value of the control signal is a control voltage;
- wherein the control signal output circuit includes a first transistor and a second transistor, wherein the first transistor generates the control signal having a value about equal to the first voltage in order to inhibit the activating current, and the second transistor alternately generates the control signal having a value that is between the first voltage and the second voltage in order to enable the activating current,
- wherein the first voltage is one of a positive actuating potential and a ground potential, and the second voltage is the other of the positive actuating potential and the ground potential, and
- wherein the control voltage is about midway between the first voltage and the second voltage.

* * * * *